(12) United States Patent
Owsley et al.

(10) Patent No.: US 7,764,205 B2
(45) Date of Patent: Jul. 27, 2010

(54) DECOMPRESSING DYNAMIC HUFFMAN CODED BIT STREAMS

(75) Inventors: Patrick A. Owsley, Moscow, ID (US); Brian Banister, Moscow, ID (US); Jason Franklin, Moscow, ID (US); Ed Coulter, Moscow, ID (US); Seth Sjoholm, Moscow, ID (US); Nathan Hungerford, Moscow, ID (US)

(73) Assignee: Comtech AHA Corporation, Moscow, ID (US)

( * ) Notice: Subject to any disclaimer, the term of this patent is extended or adjusted under 35 U.S.C. 154(b) by 0 days.

(21) Appl. No.: 12/198,312

(22) Filed: Aug. 26, 2008

(65) Prior Publication Data

US 2009/0058694 A1    Mar. 5, 2009

Related U.S. Application Data

(60) Provisional application No. 60/968,287, filed on Aug. 27, 2007.

(51) Int. Cl.
*H03M 7/40* (2006.01)

(52) U.S. Cl. .............................. 341/65; 341/51; 341/63; 341/67; 341/106

(58) Field of Classification Search ............... 341/51, 341/63, 65, 67, 106
See application file for complete search history.

(56) References Cited

U.S. PATENT DOCUMENTS

| | | | | |
|---|---|---|---|---|
| 5,173,695 | A * | 12/1992 | Sun et al. | 341/67 |
| 5,694,125 | A * | 12/1997 | Owsley et al. | 341/50 |
| 5,920,886 | A * | 7/1999 | Feldmeier | 711/108 |
| 6,121,905 | A * | 9/2000 | Redford | 341/67 |
| 6,477,615 | B1 * | 11/2002 | Tanaka | 711/108 |
| 6,573,847 | B1 * | 6/2003 | Wang | 341/67 |
| 7,219,319 | B2 * | 5/2007 | Gould et al. | 716/5 |
| 7,301,792 | B2 * | 11/2007 | Gould et al. | 365/49.15 |
| 7,412,561 | B2 * | 8/2008 | Argyres et al. | 711/108 |
| 7,577,784 | B1 * | 8/2009 | Smith | 711/108 |
| 2003/0208487 | A1 * | 11/2003 | Oh et al. | 707/6 |
| 2004/0085228 | A1 * | 5/2004 | Modha | 341/50 |
| 2008/0050469 | A1 * | 2/2008 | Kwon et al. | 426/23 |
| 2008/0273362 | A1 * | 11/2008 | Srinivasan et al. | 365/49.17 |

* cited by examiner

*Primary Examiner*—Linh V Nguyen
(74) *Attorney, Agent, or Firm*—Lee & Hayes, PLLC

(57) ABSTRACT

A method and system for decompressing dynamic Huffman coded bit streams is disclosed.

17 Claims, 9 Drawing Sheets

DECOMPRESSING DYNAMIC HUFFMAN CODED BIT STREAMS

PRIORITY AND RELATED APPLICATION

The present application claims priority to and is related to U.S. Provisional Application Ser. No. 60/968,287, entitled, "Decompressing Dynamic Huffman Coded Bit Streams," Pat Owsley, Brian Banister, Jason Franklin, Ed Coulter, Seth Sjoholm, and Nathan Hungerford, filed on Aug. 27, 2007; which is incorporated by reference herein for all that it teaches and discloses.

SUMMARY OF THE INVENTION

The invention is directed towards a method and system for decompressing dynamic Huffman coded bit streams.

In a first embodiment, the method comprises receiving one or more input bits.

In the same or alternate embodiment, the method includes searching storage locations in a ternary content addressable memory (TCAM) for matches between the input bit or input bits and a code word.

In the same or alternate embodiment, the method includes determining if the input bit or input bits matches the code word stored in the TCAM.

In the same or alternate embodiment, the method includes locating a symbol stored in a memory corresponding to the matched code word.

In the same or alternate embodiment, the method includes outputting the symbol that corresponds to the matched code word.

In the same or alternate embodiment, the method includes outputting a length N of the code word that matches the input bit or input bits.

In the same or alternate embodiment, the method includes shifting the input bits by N bits, in response to the length of the code word, in order to expose the next potential code word match or literal in the input bits.

In the same or alternate embodiment, the method includes a plurality of TCAMs operate simultaneously.

In the same or alternate embodiment, the method includes each of the plurality of TCAMs output a symbol that corresponds to a respective matched code word, each individual TCAM outputs a length of the respective matched code word, and each of the plurality of TCAMs is supplied an input bit or input bits which are offset such that no two TCAMs receive the same input bits.

In the same or alternate embodiment, the method includes one or more output lengths of the respective matched code words are added together to form a total shift length signal, the total shift length signal being fed back to shift the input bits by the length of the total shift length signal.

In the same or alternate embodiment, the method includes receiving a state signal that indicates whether the input bit or input bits correspond to a Huffman coded symbol representing a distance or a length or a literal, also stated as distance or one of a length or a literal.

In the same or alternate embodiment, the method includes two Huffman codebooks are used, a first codebook being used to signal literals or lengths, and a second codebook being used to signal distances.

In the same or alternate embodiment, the method includes the code words are for a dynamically generated Huffman code.

In the same or alternate embodiment, the method includes the distance code word and the length code word are output in the same clock cycle, or a literal code word and a length code word are output in the same clock cycle, or two literal code words are output in the same clock cycle.

In the same or alternate embodiment, the method includes the offset position into the input bits is selected for each TCAM according to the frequency of codewords in the codebook at each codeword length.

In a second embodiment, the system comprising a ternary content addressable memory (TCAM) that stores a code word and a symbol associated with the code word.

In the same or alternate embodiment, the system including a decode logic module that that receives an address from the TCAM when the TCAM detects a match between an input bit or input bits and a code word.

In the same or alternate embodiment, the system including a shift length calculation module that receives as an output from the decode logic module a length of the code word.

In the same or alternate embodiment, the system including the shift length calculation module shifts the input bits by N bits, in response to the length of the code word, in order to expose the next potential code word match in the input bit or input bits.

In the same or alternate embodiment, the system including a plurality of TCAMs and a plurality of decode logic modules operate simultaneously and in parallel.

In the same or alternate embodiment, the system including each of the plurality of TCAMs output a symbol that corresponds to a respective matched code word, each individual TCAM outputs a length of the respective matched code word.

In the same or alternate embodiment, the system including each output length of the respective matched code words are combined in the shift length calculation module to form a total shift length signal, the total shift length signal being fed back to shift the input bits by the length of the total shift length signal.

In the same or alternate embodiment, the system including receiving a state signal that indicates whether the input bit or input bits correspond to a distance or a length or a literal, also stated as distance or one of a length or a literal.

In the same or alternate embodiment, the system including the code words are dynamic Huffman codes.

In the same or alternate embodiment, the system including wherein the distance code word and the length code word are output in the same clock cycle, or a literal code word and a length code word are output in the same clock cycle, or two literal code words are output in the same clock cycle.

In the same or alternate embodiment, the system including wherein code words are weighted according to the length of the code word.

In the same or alternate embodiment, the system wherein the TCAM output is tied directly to a random access memory.

BRIEF DESCRIPTIONS OF THE DRAWINGS

Tools related to decoding dynamic Huffman bit streams are described in connection with the following drawing figures. The same numbers are used throughout the disclosure and figures to reference like components and features. The first digit in a reference number indicates the drawing figure in which that reference number is introduced.

Figure 9C:
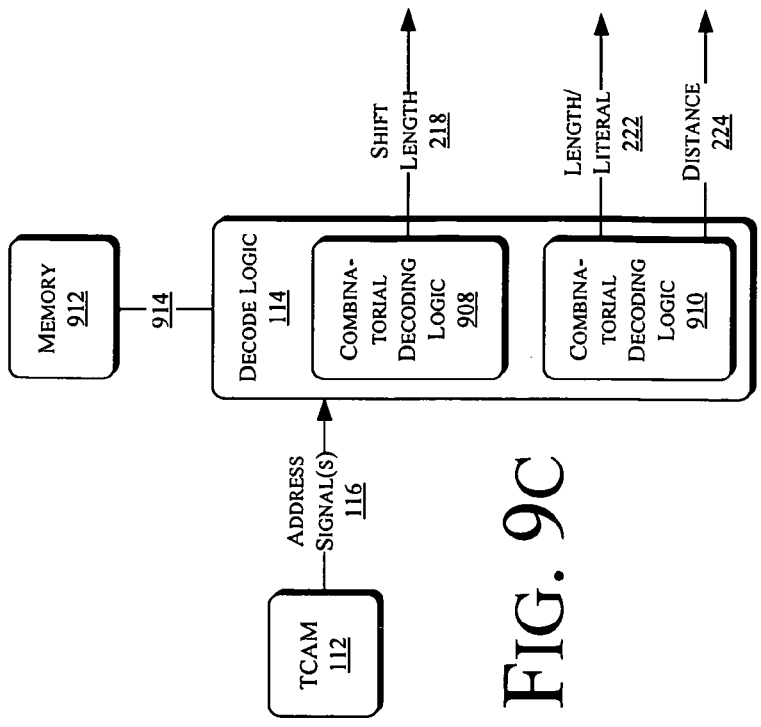
Figure 9A:
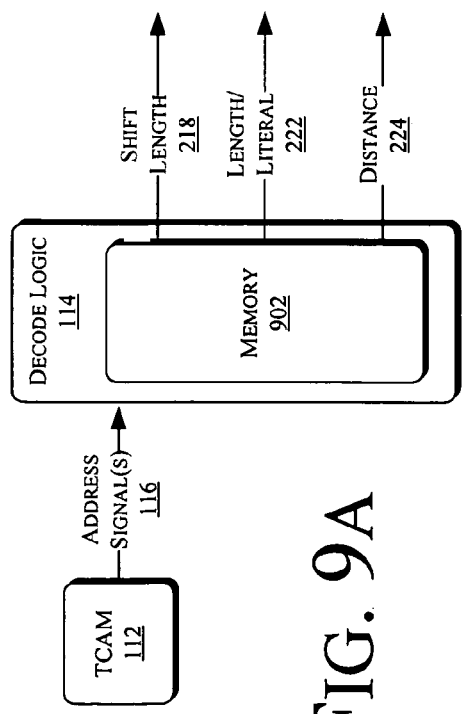
Figure 9B:
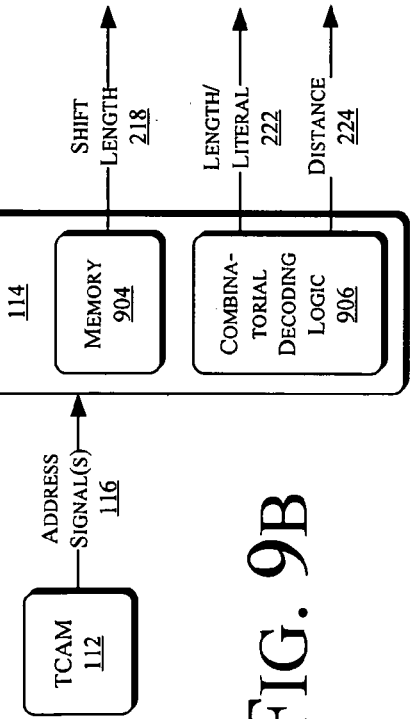

FIGS. 9A, 9B, and 9C are block diagrams of various hardware optimizations for interfacing the TCAM and a memory in implementing the decompressor.

DETAILED DESCRIPTION

Overview

The following document describes systems, methods, user interfaces, and computer-readable storage media (collectively, "tools") that are capable of performing and/or supporting many techniques and processes. The following discussion describes exemplary ways in which the tools decode dynamic Huffman bit streams. This discussion also describes other techniques and/or processes that may be performed by the tools.

Figure 1:
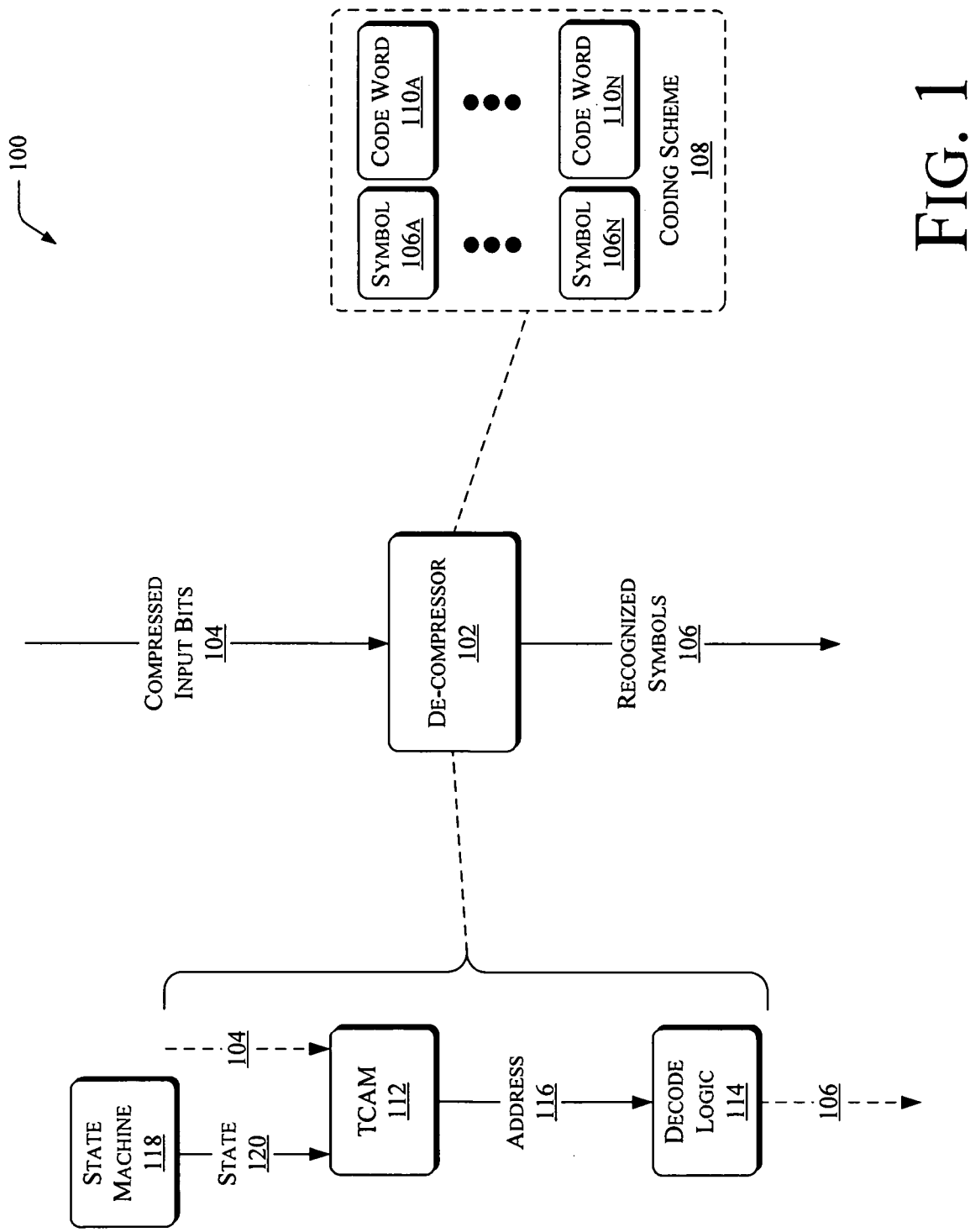
FIG. 1 is a block diagram of an operating environment suitable for decoding dynamic Huffman bit streams using, for example, tertiary content addressable memories (TCAMs).

FIG. 1 illustrates an operating environment 100 suitable for decoding dynamic Huffman bit streams using tertiary content addressable memories (TCAMs). The operating environment 100 may include a de-compressor component 102 that is operative to receive as input a stream of compressed bits 104, and to produce as output a set of recognized symbols 106.

The compressed bits 104 may have been compressed using a coding scheme 108 which maps the symbols 106 to corresponding code words 110. For example, but not limitation, FIG. 1 illustrates two input symbols 106a and 106n and corresponding code words 110a and 110n. FIG. 1 shows two input symbols only for clarity of illustration and description. However, it is understood that the coding scheme 108 may operate with any number of input symbols and code words.

In but one possible implementation, the coding scheme 108 may be a Huffman encoding scheme, whether characterized as a static or dynamic Huffman code. However, other types of coding and/or compression schemes may be appropriate as well. For example, the tools and techniques described herein may be implemented with prefix codes.

For example, the input symbols 106 may, in uncompressed form, be represented as 8-bit bytes. However, under a dynamic Huffman encoding scheme, a given block of the input symbols 106 may be associated with a given Huffman code. More specifically, individual ones of the symbols 106 may be assigned to corresponding bit patterns of one or more bits, depending on how frequently the symbols occur in the block. For example, assuming that the input symbols are text, if the letter "T" occurs most often in the block of symbols, then the letter "T" might be assigned the single bit "1" as a code word. Other symbols that occur less frequently may be assigned to code words having longer bit patterns. Since the most frequently occurring symbols are represented with fewer bits, the scheme 108 results in the compressed stream of input bits 104.

In any event, the scheme 108 used to compress the input bits 104 is also used to decompress the input bits 104. Thus, the de-compressor component 102 refers to the scheme 108 when decompressing the input bits 104 into the symbols 106.

Turning to the de-compressor component 102 in more detail, the de-compressor component 102 may include a content addressable memory (CAM) 112 and decode logic 114. The CAM 112 may be, for example, a tertiary or ternary CAM (TCAM). CAMs support two logical states, zero and one, while TCAMS support a third, "don't care" logical state. Without limiting possible implementations, the description herein provides examples that include TCAMs, although it is noted that implementations with CAMs are also possible.

The decode logic 114 may include, for example, memory of any suitable type or configuration. In addition to or instead of the memory, the decode logic 114 may also include suitable combinatorial logic. FIGS. 9A-9C below illustrates non-limiting examples of possible implementations of the decode logic.

In overview, the CAM 112 stores the code words 110 and relates them to the symbols 106. The CAM 112 receives the input bitstream 104, and matches portions of the bitstream to the code words 110 stored in the CAM. When a portion of the bitstream matches a stored code word, the CAM outputs the address of the matching code word. This matching address is referenced at 116, and is forwarded to the decode logic 114.

The decode logic may generate representations of the symbols 106, as well as possibly other data. The address 116 serves as an index into the decode logic 114. In turn, the decode logic 114 outputs at least the symbol 106 that is stored at the address 116.

The decompressor 102 may also include an implementation of a state machine 118 that provides a state signal 120 as input to the TCAM 112. For example, the state signal 120 may indicate whether the data input to the TCAM corresponds to a distance, a length or a literal. For convenience, but not limitation, the term "distance" refers to the location of a start of a match. In the industry, the term "offset" may be used synonymously with "distance". A "match" refers to a length and distance pair, in the context of, for example, Lemple-Ziv 1 (LZ1) compression. A "length" refers to a number of bytes included in a match. A "literal" is a byte in a compressed data stream that was not included in a match when the raw data stream went through the compressor.

In possible implementations, the state machine 118 may implement the following grammar. In this grammar, the "stream" corresponds to the input bits 104 shown in FIG. 1:

```
<stream> :=
    <literal><stream>
    or <length><distance><stream>
    or <end-of-file>
<length> :=
    <length>
    or <length><extra bits>
<distance> :=
    <distance>
    or <distance><extra bits>
```

Given the above grammar, for example, the state machine would enter a "literal/length" state, and remain in this state until it decodes a length codeword. Once the state machine decodes a length codeword, the state machine would enter "distance" state, since under the above grammar, the machine expects to decode a distance code word next in the stream.

In this manner, the state machine 118 and related state signal 120 may support interpretations in which data is interleaved between two or more instances of the TCAM 112 and/or the decode logic 114. For example, one or more TCAMs and/or memories may store data relating to distances, and one or more other TCAMs and/or memories may store data relating to literals. Further details on such interleaved implementations are provided below in connection with FIG. 3.

Figure 2:
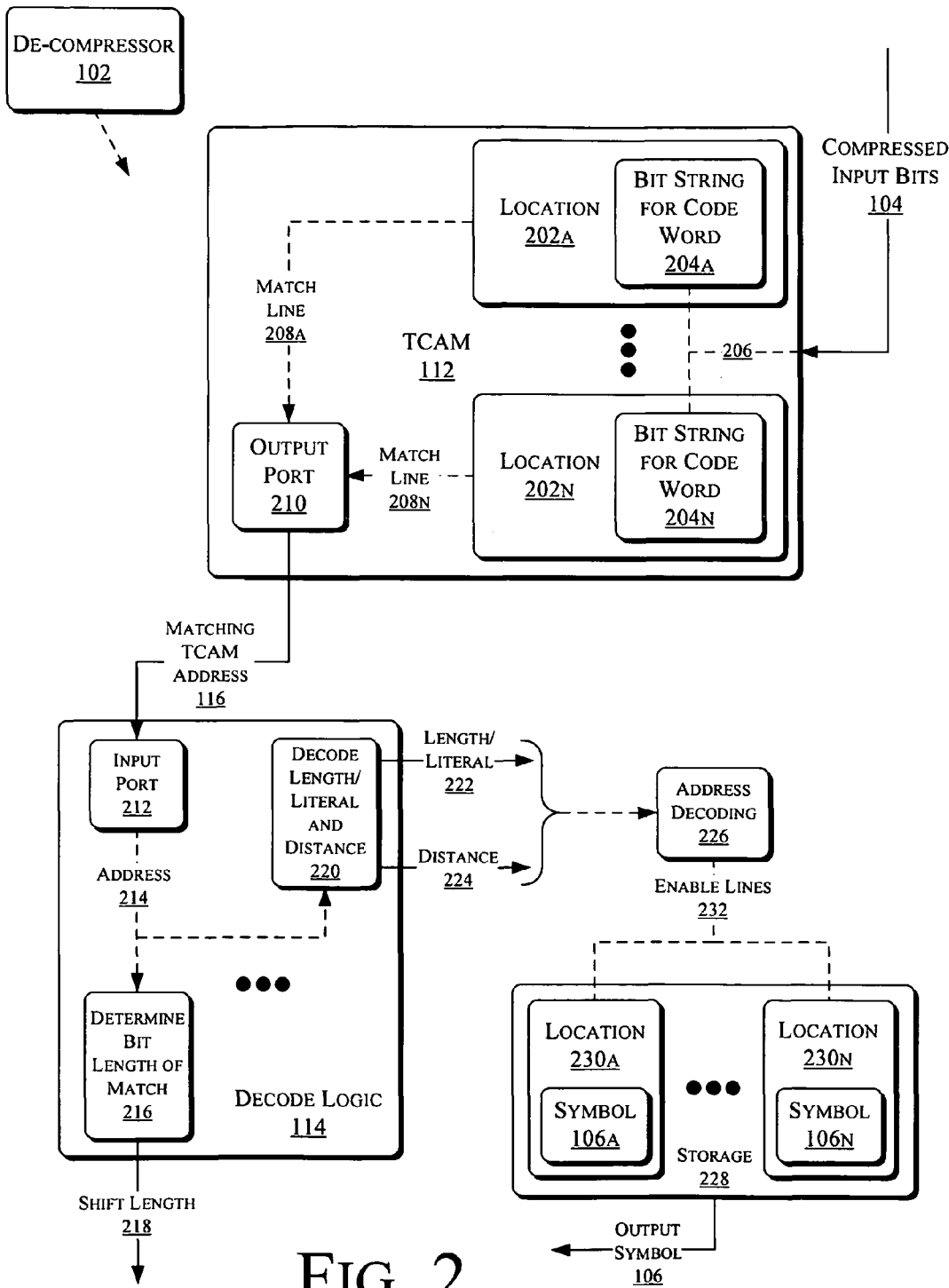
FIG. 2 is a block diagram of components and signal flows related to a de-compressor as shown in FIG. 1.

Having provided the above overview in FIG. 1, the discussion now turns to a more detailed description of the components and signal flows related to the de-compressor 102, now presented in FIG. 2.

FIG. 2 illustrates components and signal flows related to the de-compressor 102. More particularly, FIG. 2 provides additional details regarding the CAM 112, the decode logic 114, the contents thereof, and the signal flows therebetween. For convenience of description only, the CAM 112 is referenced in FIG. 2 as a TCAM.

The TCAM may include a plurality of storage locations or cells, referenced generally at 202. FIG. 2 shows two storage locations 202a and 202n for convenience of illustration only. Implementations of the TCAM could include any convenient number of storage locations 202. The locations 202 may store bit patterns or strings that correspond to the code words 110, as specified or assigned by a current coding scheme (e.g., 108 in FIG. 1). Recall that the coding scheme may implement, for example, a dynamic Huffman code, although implementations of the description herein are not limited to dynamic Huffman codes. In this example, the location 202a may contain one or more bits for a first assigned code word 204a, and the location 202n may contain a one or more bits for another assigned code word 204n. These bits are referred to generally as bit strings. Note that a location 202 may store a bit string or bit pattern that includes only one bit, or more than one bits. Thus, the term "bits strings" or "bit patterns" are chosen only for convenience, but not limitation.

Assuming a TCAM implementation, the locations 202 may contain bit strings or patterns that include one or more values of "0", "1", or "don't care". Because the TCAM supports the notion of a "don't care" value, each location 202 in the TCAM may include a data word that indicates how many bits in that location 202 are valid.

The input bits 104 may be presented in order to the TCAM 112. As the input bits arrive at the TCAM, the TCAM compares them to the bit strings or bit patterns stored in the various locations 202, as represented by the dashed line 206. When a sequence of input bits 104 matches one of the bit strings or patterns 204, then the TCAM recognizes this match, and identifies which of the locations 202 contains the bit string or pattern that currently matches the input string.

Within the TCAM, the storage locations 202 are respectively associated with corresponding match lines 208. In the implementation as illustrated in FIG. 2, a match line 208a corresponds to the location 202a, and a match line 208n corresponds to the location 202n. When a match occurs in one of the locations 202 within the TCAM, that location may assert or activate its corresponding match line 206a. The circuitry implementing the TCAM 112 may associate the locations with corresponding addresses, such that when a given match line 208 goes active, the TCAM may store the address corresponding to the active match line into an output port 210. In this manner, the output port 210 may drive or assert the matching address for reference by other components. For convenience, FIG. 2 denotes this asserted address output at 116, carried forward from FIG. 1. In some implementations, this output address 116 may be stored in a register and exposed to components external to the TCAM.

The decode logic 114 may receive as input the address 116 that was output from the TCAM, and may decode this address to determine which output symbol corresponds to the matched address. More specifically, the decode logic may include an input port 212 that latches the input address 116 for access and processing by other components of the decode logic, as represented generally by the dashed line 214.

The decode logic may include circuitry, denoted generally at 216, for determining how many bits within the compressed input bits 104 matched the code word appearing in the TCAM at the address 116. As described in more detail in FIG. 3, this bit length may be used to shift the input bits 104. Accordingly, FIG. 2 denotes the output of the bit length circuitry 216 as a shift length signal 218.

The decode logic may include circuitry, denoted generally at 220, for decoding a length/literal value of the codeword, as well as a distance associated with the length/literal. FIG. 2 denotes signals representing the length/literal value at 222, and denotes signals representing the distance at 224. As now described, the length/literal and distance signals enable the decompressor to recover the symbol that was encoded or compressed using the length/literal and distance signals.

The decompressor 102 may include address decoding circuitry 226 that receives the length/literal and distance signals 222 and 224. The decompressor 102 may also include a storage element 228, with examples of the storage element including any suitable memory and/or combinational logic. The storage element includes a plurality of storage locations or cells 230. FIG. 2 shows two example locations 230a and 230n, although the storage element may contain any suitable number of locations. The locations 230 may be associated with respective symbols 106, which were discussed above in FIG. 1. More particularly, the locations 230 may store respective representations of the various symbols that may appear in a given block of input bits 104.

The address decoding circuitry 226 may be coupled to the locations 230, such that the address decoding circuitry generates respective enable signals 232 for the various locations 230 depending on the values of the length/literal and the distance. Although not shown in FIG. 2 in the interest of clarity, respective addresses may be associated with the various locations 208. These locations 230 within the storage element 228 may be aligned with, or correspond to, the locations 202 within the TCAM, such that the TCAM output address 116 may be used to index into or search the storage element 228. Thus, when the decode logic 114 receives the matching address 116 from the TCAM, the corresponding location in the storage element is selected or otherwise becomes active, for example through asserting one of the enable lines 232. The contents of the storage location that corresponds to the selected address are then driven or asserted as output from the storage element. In this manner, the storage element 228 may produces the symbol 106 as output by reading from any of the locations 230a-230n.

In different implementations, the TCAM may arrange or organize the storage locations 202 logically into rows and columns, into arrays, or into any other suitable configuration. Likewise, the storage element may arrange or organize its storage locations 230 similarly to the TCAM. In any event, the address 116 passed from the TCAM to the storage element may reflect how the TCAM is structured. For example, the address 116 may be arranged in row-column format, if the TCAM and storage element are so arranged.

In some implementations, the bit strings 204 may be loaded into the TCAM in a particular order, based on the coding scheme 108 in effect for a given block of input bits 104. In such implementations, the symbols that correspond to the bit strings may become readily apparent once a match occurs in the TCAM.

As described above, the TCAM, decode logic, and storage element provided as parts of the decompressor 102 efficiently decompress the input bits 104 into the output symbol 106. Having provided this description of these components and related processing, the discussion turns to a description of additional components of the decompressor 102, now presented with FIG. 3.

Figure 3:
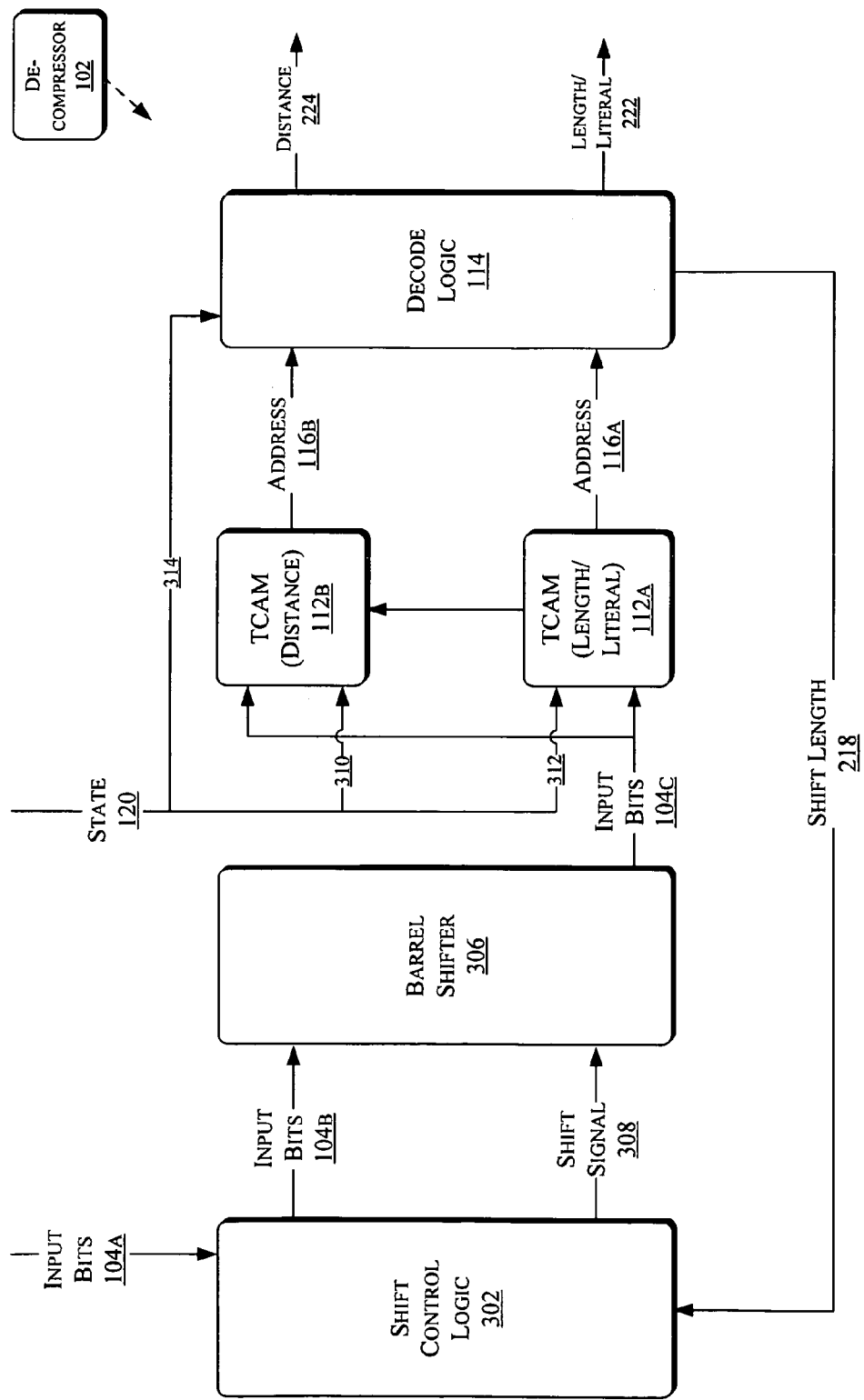
FIG. 3 is a block diagram of additional components of the decompressor.

FIG. 3 illustrates more components of the decompressor 102, in addition to the TCAM, decode logic, and storage element described above. More particularly, FIG. 3 illustrates how the TCAM and decode logic and the other components can output two or more symbols 106 per clock cycle.

The decompressor may include shift control logic 302 that receives as input the compressed bits 104. For convenience of reference, the bits 104 are referenced separately as they move through the components shown in FIG. 3. The bits as input to the shift control logic are referenced at 104a, and the bits as output from the shift control logic are referenced at 104b.

In response to a clock or other synchronization signal (not shown), the shift control logic provides the bits 104 to a barrel shifter 306. The barrel shifter may be of any suitable length, as appropriate for particular implementations. The barrel shifter is responsive to a shift signal 308, which is driven by the shift control logic, to shift-in any number of bits 104b.

In response to the shift signal, the shift register shifts-in the input bits 104b. Then, the shift register may present these bits to one or more TCAMs 112. For ease of reference, FIG. 3 denotes the bits as presented to the TCAMs at 104c. In possible implementations, a data bus of suitable width couples the TCAMs and the shift register.

The example implementation shown in FIG. 3 shows two TCAMs 112a and 112b. The TCAM 112a may store codewords related to encoded length/literal values, while the TCAM 112b may store codewords related to encoded distance values. As such, the TCAM 112a may output addresses 116a at which length or literal values may be stored, while the TCAM 112b may output addresses 116b at which distance values 312 may be stored. For convenience, the TCAMs 112a and 112b are referred to collectively as TCAMs 112 herein.

The TCAMs 112 receive the bits 104c, and perform the comparison and matching operations described above. The TCAMs produce addresses 116 corresponding to any code words stored in the TCAMs that match the input bits 104c. More specifically, the length/literal TCAM 112a may produce the matching address 116a at which length/literal codewords may be stored. In some instances, the distance TCAM 116b may also assert a matching address 116b at which distance codewords may be stored.

Recalling the state machine 118 and related grammar described above to generate the state signal 120, this grammar specifies whether a literal/length or a distance is expected to appear next in the input at any given time. The state machine may express this expectation in the state signals 120. The TCAMs 112 and/or the decode logic 114 may receive and process these state signals.

In some implementations, the TCAMs may include storage for one or more state bits whose values are set in response to the state signals. For example, these state bits may be appended or pre-pended to the storage locations 204, as represented generally in FIG. 3 by the lines 310 and 312. Depending on the state of the machine 118 at a given time, these state bits may be set so as to prevent the distance TCAM or the length/literal TCAM from asserting matches at inappropriate points within the grammar. Put differently, the state bits 310 and/or 312 may qualify or disqualify the distance TCAM and/or the length/literal TCAM from asserting matches, in response to the grammar. For example, the state bit(s) 310 may qualify or disqualify the distance TCAM 112b, while the state bit(s) 312 may qualify or disqualify the length/literal TCAM 112a.

In other implementations, the state bit(s) 120 may be routed to the decode logic 114, as represented generally at 314. The TCAMs 112a and 112b may pass any matching addresses, denoted respectively at 116a and 116b, to the decode logic. In possible implementations, an address bus having suitable width may couple the TCAMs and the decode logic, and the TCAMs may drive the matching addresses 116 onto this bus for decoding by the decode logic. Having received the state bits 314 and any matching addresses 116a and/or 116b, the decode logic may qualify or disqualify matching addresses 116 in response to the values of the state bits 314. For example, if the distance TCAM 112b asserts a match at a point the grammar where no distance codeword is expected, then the state bits 314 may disqualify this match.

The decode logic may decode the address 116 into a distance value 224 and/or a length/literal value 222. In implementations described in more detail elsewhere, the decode logic may decode the address to identify within a storage element (e.g., 228 in FIG. 2) a storage location (e.g., 230 in FIG. 2) that corresponds to the address 116. Then, the storage element may drive the contents of the identified location as output symbol 106. In possible implementations, the output symbol 106 may be asserted as binary signals onto a bus made available to components external to the decompressor 102.

In some implementations, the TCAMs and/or the decode logic may indicate how many bits were in the code word that matched the input bits 104c. Put differently, the TCAMs and/or the decode logic may indicate the length of the matching code word. These implementations assume that the coding scheme employs code words having variable lengths, such as dynamic Huffman codes. In such implementations, the length of the matching code word may be fed back as a shift length signal (e.g., 218) to the shift control logic 302.

In response to the shift length signal, the shift control logic may drive the shift signal 308 appropriately to the barrel shifter 306. For example, if the matching code word is one bit in length, then the barrel shifter shifts one bit. If the matching code word is five bits in length, then the barrel shifter shifts five bits. More generally, if the matching code word is N bits in length, then the barrel shifter shifts N bits. The net result of this shift operation is to remove "consumed" bits from further consideration, and to advance the incoming bitstream to the next candidate codeword. As bits are shifted out of the shifter 306, additional bits or bytes may be loaded from the input bits 104b. The shift control 302 will not request a shift on 308 that exceeds the number of valid bits in the barrel shifter 306?

One feature of the decompressor 102 as shown in FIG. 3 is that the decompressor may process and output at least one symbol 106 per clock pulse. The shift control logic, the barrel shifter, the TCAMs, and the decode logic may operate from a common clock signal, and are configured as shown in FIG. 3 to perform their processing within one clock cycle. Additionally, in implementations including two or more TCAMs 112a and 112b, the decompressor 102 may output, for example, distance and length/literal symbols in one clock cycle.

Figure 4:
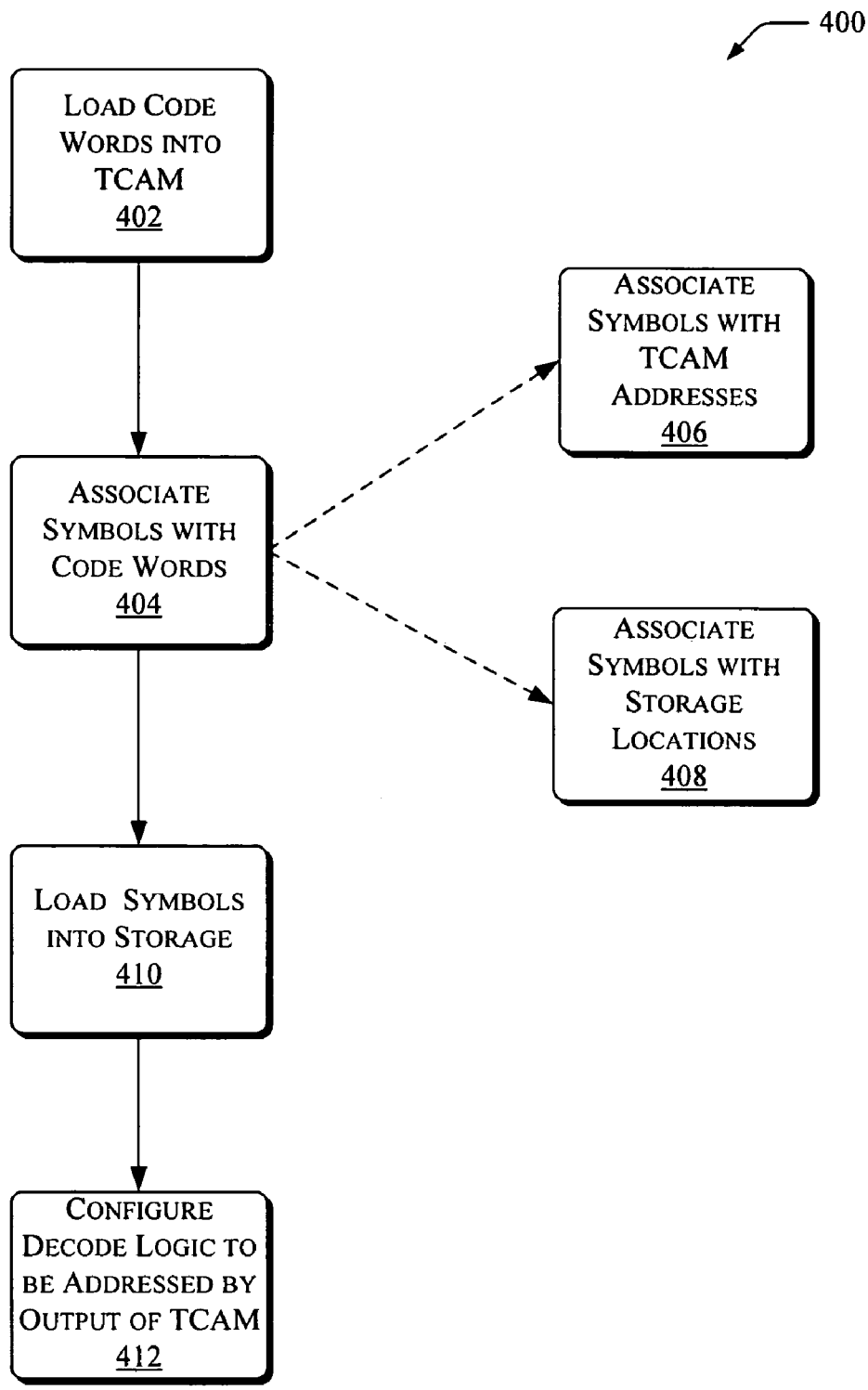
FIG. 4 is a flow diagram of a process for configuring the decompressor to perform dynamic Huffman decoding.
Figure 5:
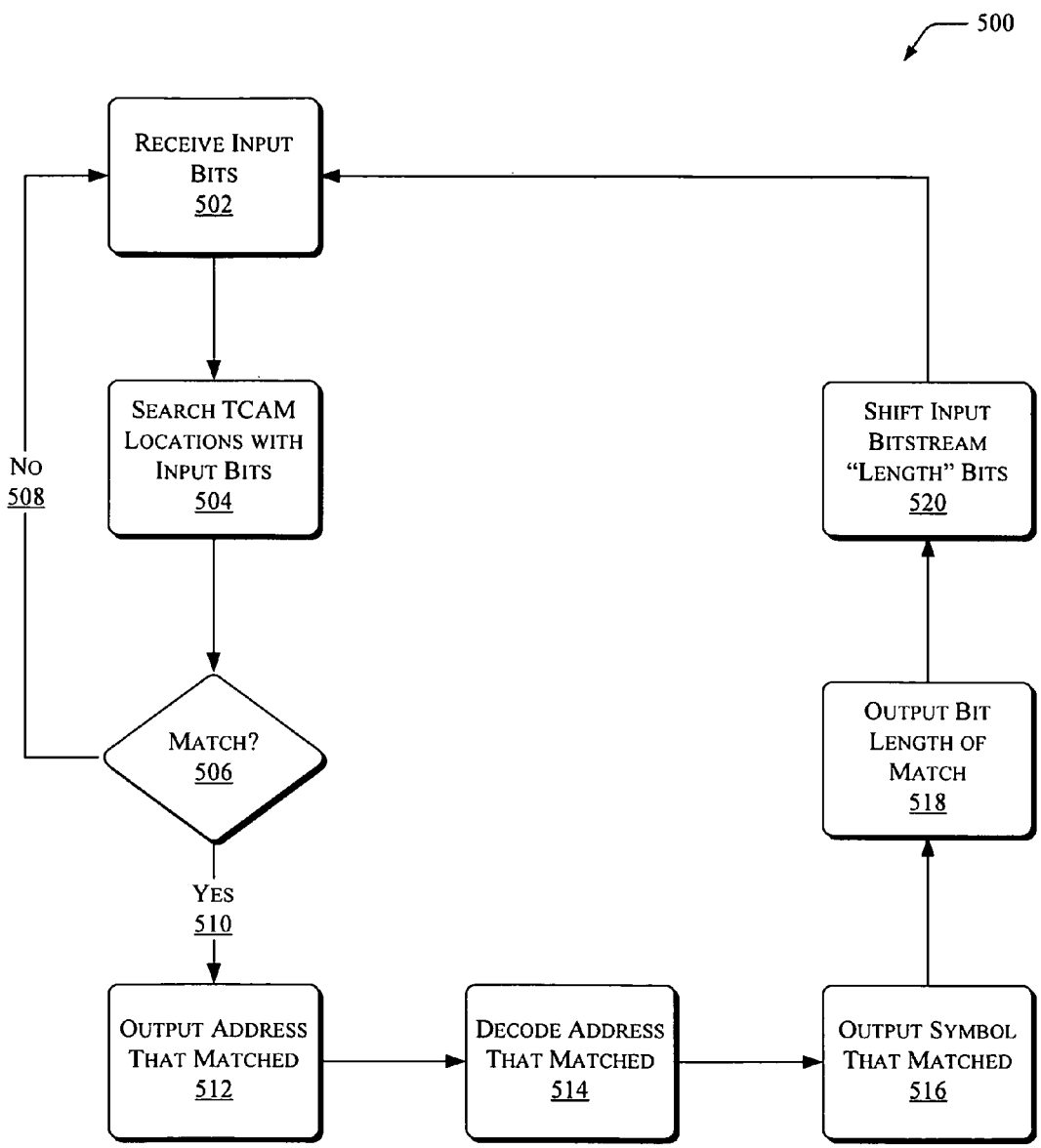
FIG. 5 is a flow diagram of a process performed by, for example, the decompressor shown in FIGS. 1-3 during operation.

Having described the components shown in FIG. 3, the discussion now proceeds to descriptions of configuration processes, shown in FIG. 4, and operational processes, shown in FIG. 5. These two Figures are now described.

FIG. 4 illustrates a process 400 for configuring the decompressor to perform dynamic Huffman decoding. While the process is described with reference to the components shown in FIGS. 1-3, it is noted that portions of the process 400 may be performed with other components without departing from the spirit and scope of the description herein.

Block 402 represents loading code words into a CAM or TCAM. Examples of the code words are provided at 110 in FIG. 1, and examples of the TCAM are provided at 112 in FIGS. 1-3. As described above, the code words may be loaded into the TCAM according to some predefined order, for example, according to the coding scheme 108. When code word matches occur, the symbol that corresponds to the matched code word is readily defined.

Block 404 represents associating symbols with the code words. Examples of the symbols are given at 106 in FIG. 1. In some implementations, the symbols may be associated with respective TCAM addresses, as represented in block 406. In other implementations, the symbols may be associated with respective locations in, a decode logic 114, as represented in block 408. As described above, if the code words are loaded into the TCAM in order, and if the symbols are arranged in the same order, then the matching TCAM address may be used to obtain the symbol that corresponds to the matching code word.

Block 410 represents loading representations of the symbols and/or bit lengths into a storage element (e.g., 228 in FIG. 2). The storage element may be associated with decode logic (e.g., 114). Finally, block 412 represents configuring the decode logic to be addressed using the output of the TCAM. For example, as described above, an address bus may couple the decode logic and the TCAM, such that the TCAM drives a matching address onto the bus, and the decode logic decodes the address asserted onto the bus.

FIG. 5 illustrates a process flow 500 performed by, for example, the decompressor 102 shown in FIGS. 1-3 during operation. While the process flow 500 is described in connection with the decompressor and other components shown in FIGS. 1-3, it is noted that portions of the process 500 may be performed with other components without departing from the spirit and scope of the description herein. In addition, the order in which FIGS. 4 and 5 present the various processing blocks is chosen only for convenience, but not limitation.

Block 502 represents receiving one or more input bits. Examples of the input bits are shown at 104 in FIGS. 1-3. These bits may be shifted-in by a barrel shifter (e.g., 306 in FIG. 3), and exposed on a bus or in a register.

Block 504 represents searching storage locations in the TCAM for matches with the input bits. More specifically, block 504 may include searching for any code word in the TCAM that matches the current set of input bits. Block 504 may be performed by the TCAM's internal circuitry.

Block 506 evaluates whether any code word matches have occurred. If not, the process flow 500 takes No branch 508 back to block 502, where one or more additional input bits are received. Afterwards, blocks 504 and 506 are repeated until one of the storage locations in the TCAM indicates a code word match.

Once a code word match occurs in block 506, the process flow 500 takes Yes branch 510 to block 512. Block 512 represents outputting the TCAM address that corresponds to the matching code word. This matching TCAM address may be exposed to the decode logic 114 via an address bus, for example.

Block 514 represents decoding the TCAM address that matched the code word. For example, the decode logic 114 may perform the decoding represented in block 514 to locate the symbol stored in the RAM corresponding to the matched code word.

Block 516 represents outputting the symbol that corresponds to the matched code word. A digital representation of this matching symbol may be driven onto a data bus.

Block 518 represents outputting a length of the code word that matched the input bits. As described above, the length of the matched code word may determine how far to shift the input bits, so as to remove "used" input bits from further consideration. In general, if the matching code word is N bits long, then the input bits are shifted N bits as well.

Block 520 represents shifting the input bits by N bits, in response to the length determination from block 518. In effect, this shift operation exposes the next potential code word in the input bits. Afterwards, the process flow returns to block 502 to process this next potential code word.

Figure 6:
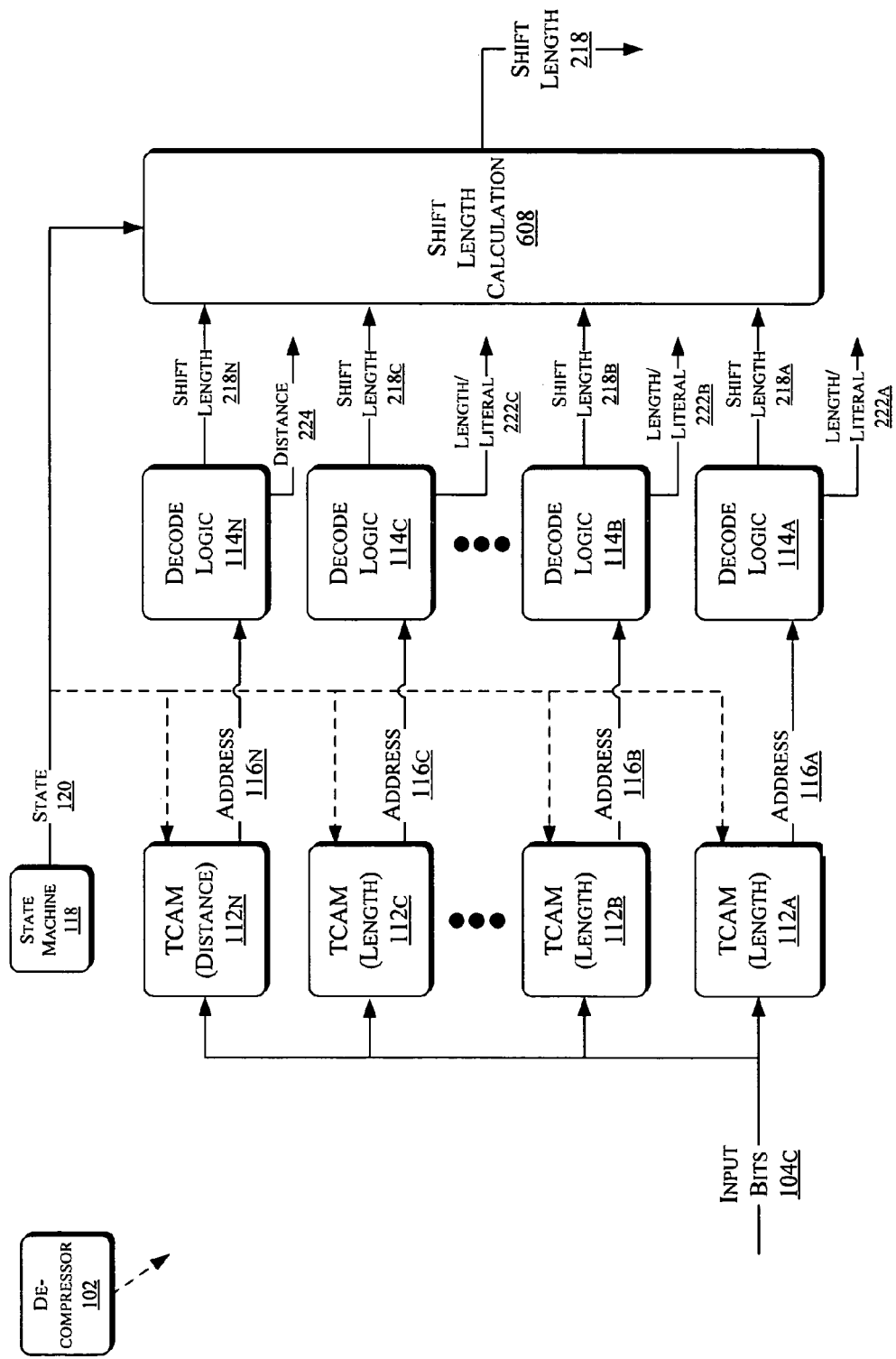
FIG. 6 is a block diagram of another embodiment of the decompressor, suitable for decoding a plurality of symbols in a single clock cycle.

FIG. 6 illustrates another embodiment of the decompressor 102, suitable for decoding a plurality of symbols in a single clock cycle. For ease of reference, but not to limit possible implementations, some items may be carried forward into FIG. 6 from previous drawings, and denoted by the same reference numerals.

As shown in FIG. 6, the decompressor 102 may include a plurality of TCAMs 112a, 112b, and 112c that store code words that encode length/literal values. While FIG. 6 illustrates three length/literal TCAMs, implementations could include any suitable number of such TCAMs. Different ones of the length/literal TCAMs may receive different portions of the input bits 104c. Assuming that the input bits 104c are transmitted via a data bus, the length/literal TCAMs may receive different lines on this data bus. In this manner, the length/literal different TCAMs may simultaneously analyze different sets of input bits 104c. While in FIG. 6 does not show clock signals in the interests of clarity, it is understood that the length/literal TCAMs may operate under common clock signals, as described above in FIG. 3.

The decompressor 102 as shown in FIG. 6 may also include one or more distance TCAMs 112n that store distance code words. Recall that under the example grammar provided above, the state machine would decode a distance code word after decoding a length code word. The decompressor 102 enables both the distance code word and the associated length code word to be decoded in the same clock cycle. More specifically, the decompressor 102 may provide one or more length/literal TCAMs 112a-112c and one or more distance TCAMs 112n. Further, the decompressor 102 may route appropriate portions of the input bits 104c to the length/literal TCAMs 112a-112c and to the distance TCAMs 112n for simultaneous processing that is synchronized by common clock signals.

As shown in FIG. 6, the length/literal TCAMs 112 may be coupled to one or more instances of decode logic 114. FIG. 6 provides an example in which the TCAMs 112 are coupled to respective instances of decode logic, denoted at 114a, 114b, 114c, and 114n. While FIG. 6 shows separate instances of decode logic and TCAMs, it is noted that in implementations, the decode logic 114a-114n could be consolidated or integrated into one block of decode logic, and the TCAMs 112a-112n could be consolidated or integrated into a single TCAM.

The blocks of decode logic 114 may generate respective instances of the shift length signals, which FIG. 6 denotes at 218a, 218b, 218c, and 218n. As described elsewhere herein, these shift length signals indicate how many of the input bits 104c were "consumed" in a given match, and also indicate how much to shift the input bitstream to discard these matched bits.

Turning to the TCAMs 112 in more detail, these TCAMs may assert respective address signals when code word matches occur. The example shown in FIG. 6 provides respective address signals 116a, 116b, 116c, and 116n that pass between TCAMs 112 and decode logic 114. In response to the address signals 116a-116c, the decode logic 114a-114c may generate respective signals that represent length or literal values, with FIG. 6 denoting examples of these length/literal values at 222a, 222b, and 222c. Additionally, the decode logic 114n may generate a distance signal (e.g., 224) in response to the address signal 116n.

The decompressor may also include a shift length calculator 608 that receives the shift length signals 218 from the decode logic. The shift length calculator may include at least an adder circuit or other suitable accumulator circuit, and may be included as part of the shift control logic 302 shown in FIG. 3, but is referenced in FIG. 6 for convenience only. The shift length calculator 608 accumulates the various shift lengths reported by the decode logic into a total shift length signal, denoted in FIG. 6 at 218.

In but one possible operational example, when one of the length/literal TCAMs 112a-112c asserts a match on a given portion of the input bits 104c, then one of the distance TCAMs 112n may be simultaneously decoding the "next" portion of the input bits 104c. This "next" portion of the input bits would contain the distance code word that is associated with the length code word. In this manner, the decompressor 102 may output both the length length/literal code word and the related distance code word during the same clock cycle.

FIG. 6 shows one distance TCAM 112n only for convenience of illustration. However, it is noted that implementations of the decompressor 102 may include one or more distance TCAMs 112n. An example of such implementations is shown in FIG. 7, and is now described.

FIG. 6 also carries forward the state machine 118 and state signals 120. In the example shown in FIG. 6, the state signals 120 are inputs to the shift length calculator 608. However, as described above, the state signals may also be inputs to the TCAMs 112, as indicated by the dashed lines input into the TCAMs. In implementations that include dual-purpose TCAMs, which may decode either distance codewords or length/literal codewords, the state information may enable the decompressor to enable or disable address matches asserted by the appropriate TCAMs, depending on whether a distance or length/literal is expected at a given time.

Figure 7:
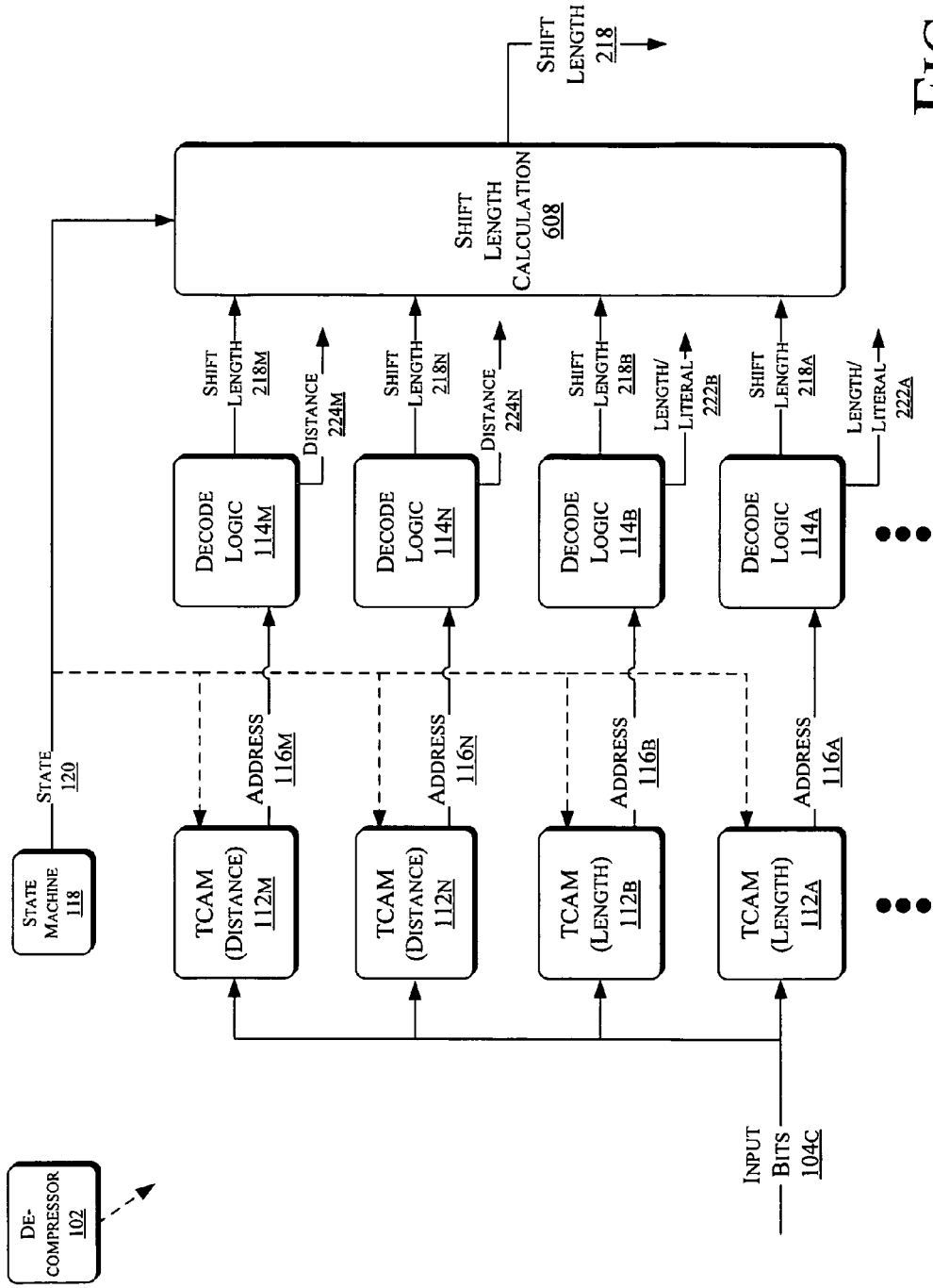
FIG. 7 is a block diagram of an implementation in which the decompressor that includes two or more length TCAMs and two or more distance TCAMS.

FIG. 7 illustrates an implementation in which the decompressor 102 includes two or more length/literal TCAMs 112a and 112b and two or more distance TCAMs 112n and 112m. The address outputs from the length/literal TCAMs 112a and 112b are referenced at 116a and 116b, and the address outputs from the distance TCAMs 112n and 112m are referenced at 116n and 116m.

In addition, FIG. 7 illustrates decode logic 114a, 114b, 114n, and 114m, which receive the address signals 116a, 116b, 116n, and 116m, respectively. The decode logic blocks 114 also generate respective shift length signals 218a, 218b, 218n, and 218m. Finally, the decode logic blocks 114a and 114b coupled to the length/literal TCAMs 112a and 112b may generate respective length/literal signals 222a and 222b, while the distance TCAMs 112n and 112m may generate respective distance signals 222n and 222m.

The implementation shown in FIG. 7 may be suitable for performing three-byte matches in one clock cycle. For example, it may be acceptable in some circumstances to consume two clock cycles while performing a four-byte match. However, in the context of, for example, implementing the DEFLATE algorithm, it may not be acceptable to consume two clock cycles while performing a three-byte match. In this context, the implementation shown in FIG. 7 may be particularly appropriate.

The implementation shown in FIG. 7 may operate by analyzing an input coding scheme (e.g., 108 in FIG. 1), such as a dynamic Huffman tree. For any three-byte values included in the dynamic Huffman tree, this analysis may determine how many bits are used to encode such values. The appropriate input bits 104c may then be routed through multiplexer stages, and provided as input to the second distance TCAM 112m. When a three-byte match is detected by, for example the length/literal TCAMs 112a and/or 112b, then the length and distance values may be output in one clock cycle.

Extending the above descriptions of FIGS. 6 and 7, implementations of the decompressor 102 may include any number of length/literal TCAMs (e.g., 112a and 112b) and distance TCAMs (e.g., 112n and 112m). For example, assume that each TCAM may process up to N bits, and that the shift register (e.g., 306) may present M input bits to the TCAMs, where M and N are integers, with M>N. In this example, the first length TCAM 112a may receive input bits 1:N, the second length TCAM 112b may receive input bits 2:(N+1). This can continue up to a length TCAM that receives input bits N+1:2N. In this example, the input bits as provided to successive TCAMs are effectively "shifted" one bit. The distance TCAMs can be arranged in a like manner with the first receiving bits is also 1:N.

The foregoing approach may be suitable in some instances, but where N is large, this approach may also entail including numerous TCAMs in the decompressor 102. These numerous TCAMs increase the probability that the decompressor 102 may recognize and output multiple symbols in a given clock cycle. However, where packaging or other manufacturing considerations suggest that the number of TCAMs be reduced, other approaches may be appropriate. These other approaches may, for example, reduce the total number of TCAMs included in the decompressor 102, in exchange for a reduced probability that the decompressor 102 may recognize and output multiple symbols in a given clock cycle. These other approaches are now described with a second example, as illustrated in FIG. 8.

Figure 8:
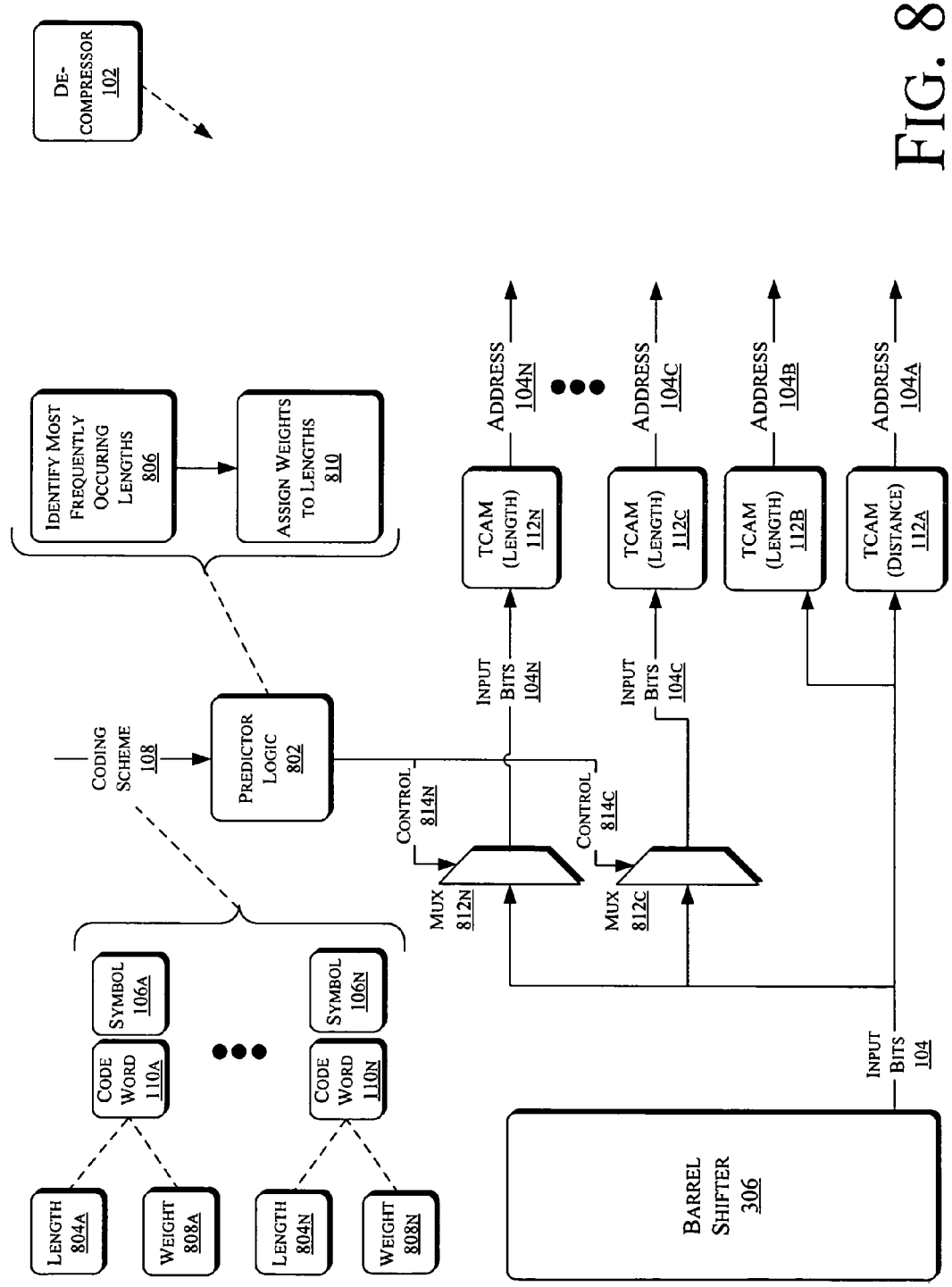
FIG. 8 is a block diagram of a scenario in which incoming code words are weighted according to their lengths to reduce the number of TCAMs included in implementations of the decompressor.

FIG. 8 illustrates a scenario in which incoming code words are weighted according to their lengths. As described in connection with FIG. 1, the decompressor 102 may receive a block of input bits 104 for decompressing, along with a coding scheme 108 under which the input bits 104 were compressed. The coding scheme may include a set of code words 110a-110n and corresponding symbols 106a-106n.

As shown in FIG. 8, in preparing to decompress the input bits 104, the decompressor 102 may include predictor logic 802 for determining which bit lengths 804a-804n most frequently occur within the code words 110a-110n. FIG. 8 denotes this determination or identification at 806. For different code words having different lengths, the predictor logic may associate weights 808a-808n with these code words, depending on how often the lengths of these code words occur within the block of input bits 104. For example, if code words having a length of four bits occur most frequently, then all code words having a length of four bits would be assigned a relatively high weight 808. If code words having a length of five bits occur the next most frequently, then all code words having a length of five bits would be assigned a slightly lower weight 808. This process may be repeated until all of the code words 110 in the current coding scheme 108 have been weighted. FIG. 8 denotes the assignment of weights to the code word lengths at 810. Another method may include assigning the highest weight to the shortest codeword, assigning the next highest weight to the next shortest codeword, and so on. This method may continue until all code words are assigned a weight.

The decompressor 102 may include one or more multiplexers 812, with FIG. 8 providing an example that includes two multiplexers 812c and 812n. These multiplexers may receive input bits 104 from a barrel shifter (e.g., 306), and may also receive control signals 814 from the predictor logic. FIG. 8 provides two control signals 814c and 814n, routed respectively to the multiplexers 812c and 812n. The predictor logic defines the control signals 814 and drives them to the multiplexers based on the weighting assigned to the various lengths of code words.

The decompressor as shown in FIG. 8 may include a TCAM for recognizing distance code words, denoted at 112a, and a TCAM for recognizing length/literal code words, denoted at 112b. These two TCAMs may receive at least a portion of the input bits 104. The TCAMs 112a and 112b may generate addresses 104a and 104b for any code word matches detected within the input bits 104. In some implementations, the TCAMs 112a and 112b may also receive state information (not shown in the interests of clarity) to distinguish between distance code words and length-literal code words.

The decompressor as shown in FIG. 8 may also include one or more additional length TCAMs 112, with specific examples denoted at 112c and 112n. These TCAMs may receive different subsets of the input bits 104, as selected by the multiplexers 812c and 812n in response to the control signals 814c and 814n. More specifically, the multiplexer (MUX) 812c may select the input bits 104c for presentation to the TCAM 112c, and the MUX 812n may select the input bits 104n for presentation to the TCAM 112n.

The input bits 104c and 104n as presented to the TCAMs may represent some subset of the input bits 102, chosen in response to the processing performed by the predictor logic 802. More specifically, the predictor logic may compose and drive the control signals 814 based on the most frequently occurring lengths of code words appearing in a given coding scheme (e.g., 108). As TCAMs 112a and 112b have a higher probability of receiving one of the higher frequency code lengths, the predictor logic selects the most likely subsets of input bits 104 and directs them to TCAMs 112c and 112n.

Continuing with FIG. 8, the decompressor 102 is assumed to include a reduced number of TCAMs 112a, 112b, 112c, and 112n, as compared to the example given above in FIG. 7. The MUXes 812c and 812n may be configured to send data 104c and 104n that is offset by the highest weight and next highest weight code words in case TACM 112a or 112b consume that number of bits. Recall that the weights indicate how frequently code words having a given length occur under the current coding scheme 108. For example, if all code words defined under a given coding scheme 108 contain four or more bits, then there is no need to configure a MUX to assume that TCAM 112a or 112b will receive a codeword of 3 bits or less. Therefore, the total number of TCAMs may be reduced, while still accommodating code words of the most frequently-occurring lengths.

The example shown in FIG. 8 provides two additional length/literal TCAMs 112c and 112n that are coupled to multiplexers 812c and 812n to receive input in response to the control signals 814. However, it is noted that implementations of the description herein may include any number of additional TCAMs and multiplexers, recognized as suitable in different applications and circumstances. Also, these additional TCAMs may be length/literal TCAMs and/or distance TCAMs, as appropriate.

FIGS. 9A, 9B, and 9C illustrate various hardware optimizations for interfacing a TCAM and the decode logic in implementing the decompressor 102. For ease of reference, but not to limit possible implementations, some items may be carried forward into FIGS. 9A-9C from previous drawings, and denoted by the same reference numerals.

As shown in FIG. 9A, a TCAM 112 may generate an address signal 116 to indicate that one of the code words stored in the TCAM has matched some portion of an input stream of bits (e.g., 104 in FIG. 1). The TCAM 112 may be coupled to a decode logic (e.g., 114), which may include one or more memory elements, denoted generally at 902. The decode logic may pass the address signals 116 to the memory, which in turn may decode these address signals to output a shift length signal (e.g., 218), a length/literal value (e.g., 222), and a distance value (e.g., 224). The memory element 902 may be implemented using any suitable storage technology, for example, RAM, ROM, flip-flops, or the like.

In FIG. 9B, the TCAM 112 provides the address signal 116 to a decode logic 114). The decode logic may include a memory element 904 and combinatorial decoding logic 906. The description of the memory element 902 in FIG. 9A applies equally to the memory element 904 shown in FIG. 9B. In the example shown in FIG. 9B, the memory element may decode the address signals 116 to output the shift length signal 218, while the combinatorial decoding logic may decode the address signals 116 to output the length/literal value 222 and the distance value 224.

In FIG. 9C, the TCAM 112 provides the address signal 116 to a decode logic 114. The decode logic may include instances of combinatorial decoding logic, denoted at 908 and 910. In the example shown in FIG. 9C, the combinatorial decoding logic 908 may decode the address signals 116 to output the shift length signal 218, while the combinatorial decoding logic 910 may decode the address signals 116 to output the length/literal value 222 and the distance value 224. To perform this decoding, the combinatorial decoding logic may cooperate with a memory component 912. The description of the memory element 902 in FIG. 9A applies equally to the memory element 912 shown in FIG. 9C. The line 914 represents signal transfers between the decode logic 114 and the memory 912 in FIG. 9C.

CONCLUSION

Although the system and method has been described in language specific to structural features and/or methodological acts, it is to be understood that the system and method defined in the appended claims is not necessarily limited to the specific features or acts described. Rather, the specific features and acts are disclosed as exemplary forms of implementing the claimed system and method.

In addition, regarding certain data and process flow diagrams described and illustrated herein, it is noted that the processes and sub-processes depicted therein may be performed in orders other than those illustrated without departing from the spirit and scope of the description herein. Also, while these data and process flows are described in connection with certain components herein, it is noted that these data and process flows could be performed with other components without departing from the spirit and scope of the description herein

The invention claimed is:

1. A method, comprising:

receiving one or more input bits;

searching storage locations in a ternary content addressable memory (TCAM) for matches between the input bit or input bits and a code word;

determining if the input bit or input bits matches the code word stored in the TCAM;

locating a symbol stored in a memory corresponding to the matched code word;

outputting the symbol that corresponds to the matched code word;

outputting a length N of the code word that matches the input bit or input bits;

shifting the input bits by N bits, in response to the length of the code word, in order to expose the next potential code word match or literal in the input bits; and receiving a state signal that indicates whether the input bit or input bits correspond to a Huffman coded symbol representing a distance or a length or a literal.

2. The method of claim 1, wherein a plurality of TCAMs operate simultaneously.

3. A method comprising:

receiving one or more input bits;

searching storage locations in a ternary content addressable memory (TCAM) for matches between the input bit or input bits and a code word;

determining if the input bit or input bits matches the code word stored in the TCAM;

locating a symbol stored in a memory corresponding to the matched code word;

outputting the symbol that corresponds to the matched code word;

outputting a length N of the code word that matches the input bit or input bits; and shifting the input bits by N bits, in response to the length of the code word, in order to expose the next potential code word match or literal in the input bits, wherein each of the plurality of TCAMs output a symbol that corresponds to a respective matched code word, each individual TCAM outputs a length of the respective matched code word, and each of the plurality of TCAMs is supplied an input bit or input bits which are offset such that no two TCAMs receive the same input bits.

4. The method of claim 3, wherein one or more output lengths of the respective matched code words are added together to form a total shift length signal, the total shift length signal being fed back to shift the input bits by the length of the total shift length signal.

5. A method comprising:

receiving one or more input bits;

searching storage locations in a ternary content addressable memory (TCAM) for matches between the input bit or input bits and a code word;

determining if the input bit or input bits matches the code word stored in the TCAM;

locating a symbol stored in a memory corresponding to the matched code word;

outputting the symbol that corresponds to the matched code word;

outputting a length N of the code word that matches the input bit or input bits;

shifting the input bits by N bits, in response to the length of the code word, in order to expose the next potential code word match or literal in the input bits; and receiving a state signal that indicates whether the input bit or input bits correspond to a Huffman coded symbol representing a distance or a length or a literal, wherein two Huffman codebooks are used, a first codebook being used to signal literals or lengths, and a second codebook being used to signal distances.

6. The method of claim 1, wherein the code words are for a dynamically generated Huffman code.

7. A method comprising:

receiving one or more input bits;

searching storage locations in a ternary content addressable memory (TCAM) for matches between the input bit or input bits and a code word;

determining if the input bit or input bits matches the code word stored in the TCAM;

locating a symbol stored in a memory corresponding to the matched code word;

outputting the symbol that corresponds to the matched code word;

outputting a length N of the code word that matches the input bit or input bits;

shifting the input bits by N bits, in response to the length of the code word, in order to expose the next potential code word match or literal in the input bits; and receiving a state signal that indicates whether the input bit or input bits correspond to a Huffman coded symbol representing a distance or a length or a literal, wherein a plurality of TCAMs operate simultaneously and wherein the distance code word and the length code word are output in a same clock cycle, or a literal code word and a length code word are output in the same clock cycle, or two literal code words are output in the same clock cycle.

8. A method comprising:

receiving one or more input bits;

searching storage locations in a ternary content addressable memory (TCAM) for matches between the input bit or input bits and a code word;

determining if the input bit or input bits matches the code word stored in the TCAM;

locating a symbol stored in a memory corresponding to the matched code word;

outputting the symbol that corresponds to the matched code word;

outputting a length N of the code word that matches the input bit or input bits; and shifting the input bits by N bits, in response to the length of the code word, in order to expose the next potential code word match or literal in the input bits, wherein the offset position into the input bits is selected for each TCAM according to the frequency of code words in a code book at each code word length.

9. A system, comprising:

a plurality of ternary content addressable memory (TCAM) that stores a code word and a symbol associated with the code word;

a plurality of decode logic modules that receives an address from one of the plurality of the TCAMs when one of the plurality of the TCAMs detects a match between an input bit or input bits and a code word; and a shift length calculation module that receives as an output from the decode logic module a length of the code word;

wherein the shift length calculation module shifts the input bits by N bits, in response to the length of the code word, in order to expose the next potential code word match in the input bit or input bits; and wherein the plurality of TCAMs and the plurality of decode logic modules operate simultaneously and in parallel, and the input bits of at least one of the TCAMs comprise a shifted version of the input bits of one of the plurality of TCAMs.

10. The system of claim 9, wherein each of the plurality of TCAMs output a symbol that corresponds to a respective matched code word, each individual TCAM outputs a length of the respective matched code word.

11. The system of claim 10, wherein each output length of the respective matched code words are combined in the shift length calculation module to form a total shift length signal, the total shift length signal being fed back to shift the input bits by the length of the total shift length signal.

12. The system of claim 9, further comprising receiving a state signal that indicates whether the input bit or input bits correspond to a distance or a length or a literal.

13. The system of claim 9, wherein the code words are dynamic Huffman codes.

14. A system comprising:
- a plurality of ternary content addressable memories (TCAMs) configured to store a code word and a symbol associated with the code word;
- a decode logic module that receives an address from one of the plurality of TCAMs when the TCAMs detect a match between an input bit or input bits and a code word;
- a shift length calculation module that receives as an output from the decode logic module one or more lengths of the one or more code words; and
- wherein the shift length calculation module shifts the input bits by N bits, in response to the length of the one or more code words, in order to expose the next potential code word match in the input bit or input bits;
- wherein a distance code word and a length code word are output in a same clock cycle, or a literal code word and a length code word are output in the same clock cycle, or two literal code words are output in the same clock cycle; and
- wherein the plurality of TCAMs operate simultaneously and in parallel, and the input bits of at least one of the plurality of TCAMs comprise a shifted version of the input bits of one of the plurality of TCAMs.

15. The system of claim 9, wherein an offset into the input bits is chosen for the TCAM based upon a weighting according to the length of the code words.

16. The system of claim 9, wherein the TCAM output is tied directly to a random access memory.

17. A system comprising:
- a plurality of ternary content addressable memories (TCAMs) configured to store a code word and a symbol associated with the code word;
- wherein the plurality of TCAMs operate simultaneously and in parallel, and the input bits of at least one of the plurality of TCAMs comprise a shifted version of the input bits of one of the plurality of TCAMs; and
- wherein the outputs of a plurality of TCAMs is used to decode a plurality of sequentially coded symbols in the same clock cycle.

* * * * *